(12) United States Patent
Kusaki et al.

(10) Patent No.: US 8,053,179 B2
(45) Date of Patent: Nov. 8, 2011

(54) METHOD FOR MANUFACTURING SUBSTRATE FOR MAKING MICROARRAY

(75) Inventors: Wataru Kusaki, Niigata (JP); Takeshi Kinsho, Niigata (JP); Toshinobu Ishihara, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 360 days.

(21) Appl. No.: 12/071,889

(22) Filed: Feb. 27, 2008

(65) Prior Publication Data
US 2008/0233521 A1  Sep. 25, 2008

(30) Foreign Application Priority Data

Mar. 22, 2007  (JP) ................................. 2007-074668

(51) Int. Cl.
*G03F 7/26* (2006.01)
(52) U.S. Cl. ........................ 430/324; 430/320
(58) Field of Classification Search .................. 430/320, 430/324, 270.1, 314
See application file for complete search history.

(56) References Cited

U.S. PATENT DOCUMENTS

| | | | | |
|---|---|---|---|---|
| 4,881,109 | A * | 11/1989 | Ogawa | 257/253 |
| 6,517,994 | B2 * | 2/2003 | Watanabe | 430/270.1 |
| 6,641,975 | B2 * | 11/2003 | Takeda et al. | 430/270.1 |
| 2005/0233366 | A1 | 10/2005 | Mino | |

FOREIGN PATENT DOCUMENTS

| | | |
|---|---|---|
| JP | A 62-50657 | 3/1987 |
| JP | A 4-221630 | 8/1992 |
| JP | A-2004-294085 | 10/2004 |
| JP | A 2005-77210 | 3/2005 |
| JP | A-2005-326400 | 11/2005 |
| JP | A 2006-124314 | 5/2006 |
| JP | A 2006-225476 | 8/2006 |
| WO | WO03/087798 A1 | 10/2003 |

OTHER PUBLICATIONS

Wallraff et al., "DNA sequencing on a chip", *Chemtech*, pp. 22-32, Feb. 1997.

* cited by examiner

*Primary Examiner* — Cynthia Kelly
*Assistant Examiner* — Caleen Sullivan
(74) *Attorney, Agent, or Firm* — Oliff & Berridge, PLC

(57) ABSTRACT

A method for manufacturing a substrate for making a microarray wherein a monomolecular film for immobilizing a target molecule can be simply formed position-selectively in manufacture of the substrate for making the microarray is provided.

A method for manufacturing a substrate for making a microarray, comprising, a step of forming a resist film on the substrate using a chemically amplified positive resist composition using a copolymer where a content of a monomer unit having a hydroxyl group is 5 mole % or less relative to total monomer units as a binder; a step of patterning the resist film; a step of forming a monomolecular film having a silicon oxide chain on the substrate having the patterned resist film; and subsequently a step of removing the resist film.

9 Claims, 1 Drawing Sheet

METHOD FOR MANUFACTURING SUBSTRATE FOR MAKING MICROARRAY

BACKGROUND OF THE INVENTION

1. Field of the Invention

The present invention relates to analysis technology involved in gene sequences in analyses of biologically functional molecules, particularly DNA sequences and in genetic diagnosis, and a method for manufacturing a substrate for making a device for analysis used for those analyses.

2. Description of the Related Art

The analysis technology for DNA sequences of genes including human genomic analysis has been advanced rapidly in recent years, and has been developed for the study on gene functions and diagnosis of diseases by the gene based on that information. Numerous studies on so-called DNA chips, DNA microarrays as the technology for performing these analyses and functional studies of the genes on a large scale in a short time have been performed.

In the DNA microarray, DNA having the particular sequence is immobilized in a microspace and a DNA strand having a complementary sequence in a sample is detected. As a methodology for making the DNA microarray capable of processing on a large scale and with high speed, a method of making the microarray modified with various DNA in surprisingly few steps by performing a position-selective synthesis of DNA sequences over multiple stages using photolithography which is a method for making a semiconductor has been proposed in CHEMTECH February 1997, pp. 22. According to this, a possibility has been shown that the microarray for examining more than one billion DNA sequences at the same time can be make by repeating binding of methodically and position-selectively different nucleotides 15 times.

Meanwhile, if the DNA strand having the above complementary sequence can be electrically detected, it becomes possible to analyze by a high speed and simple method. Domestic Re-publication of WO2003/087798 and Japanese Patent Laid-open (Kokai) No. 2005-77210-A have been already known as attempts to make the microarray using a semiconductor apparatus for the purpose of such an electric detection. In these semiconductor apparatuses, the presence or absence of the complementary DNA strand is detected on a microchip as a practical application of a sensor by a field effect transistor known conventionally.

By the way, to make the DNA microarray capable of analyzing on a large scale and with high speed, it is necessary to immobilize the DNA strand on the substrate for making the microarray position-selectively to the microspace and not to cause problems such as detachment. In order to analyze the biologically functional molecules including DNA molecules, as the method for two-dimensionally immobilizing them on a metal, the method of using specific absorption of a sulfur atom on a gold surface is known and described in, for example, Domestic Re-publication of WO2003/087798. Meanwhile, the method in which a monomolecular film having a silicon oxide chain is formed on the substrate so that the immobilized molecule is not detached and an enzyme is certainly immobilized on the semiconductor, and the enzyme is immobilized on an alkyl chain extending from a silicon atom has been known quite some time ago, and disclosed in Japanese Patent Laid-open (Kokai) No. 62-50657-A. This method is also mentioned to be applicable in Japanese Patent Laid-open (Kokai) No. 2005-77210-A.

For making the microarray, when a material for recognition of such as DNA or a peptide is immobilized on the substrate, the above method of using the monomolecular film having the silicon oxide chain is the method for immobilization in which the above-mentioned problem such as detachment hardly occurs.

But, if this method is used, when actually a oxidized film formed on the substrate although the surface of the substrate is formed of a metal oxide or a metal, the monomolecular film having the silicon oxide chain forms a film on the overall surface.

Thus, when the monomolecular film is placed position-selectively, it is useful to protect with a resist film. However, when a novolak resist used in commonsense for forming a pattern requiring the accuracy in approximately micron orders or a resist for processing the semiconductor developed for KrF excimer having a some excessive miniaturization performance is used, the resist film itself reacts with the material for forming the monomolecular film and the monomolecular film is also formed on the resist film. Thus, extremely complicated manipulations are required for forming the film position-selectively.

Therefore, it is substantially impossible to use such a resist for processing the semiconductor for manufacturing the substrate for making the microarray. A resist technology capable of simply forming the monomolecular film in position-selectively has been desired.

SUMMARY OF THE INVENTION

The present invention has been made in the light of the above circumstance, and aims at providing a method for manufacturing a substrate for making a microarray, in which a monomolecular film for immobilizing a target molecule is simply formed in position-selectively, in manufacturing the substrate for making the microarray.

The present invention has been made for solving the above-mentioned problem, and provides the method for manufacturing the substrate for making the microarray, comprising; at least, a step of forming a resist film on the substrate using a chemically amplified positive resist composition using a copolymer where a content of a monomer unit having a hydroxyl group is 5 mole % or less relative to total monomer units as a binder; a step of patterning the resist film; a step of forming a monomolecular film having a silicon oxide chain on the substrate having the patterned resist film; subsequently a step of removing the resist film. In this case, as the copolymer of the binder, it is preferable to use a copolymer not containing the monomer unit having the hydroxyl group.

This way, as using of the resist pattern formed using the binder containing the hydroxyl group at a low level, it is prevented that the monomolecular film is formed on the resist pattern, and the resist pattern which is not needed after forming the monomolecular film can be removed with a simple treatment. Thus, the monomolecular film can be simply formed in position-selectively.

In this case, as the copolymer of the binder, it is preferable to use a copolymer containing a styrene derivative unit having an acidic functional group protected with a protecting group capable of being deprotected with an acid and a (meth)acrylate derivative unit having a lactone structure as an adhesive functional group.

This way, by containing the above unit in the copolymer of the binder, good adhesiveness of the resist film to the substrate is assured. Therefore, it reduces the possibility that the resist film is detached during the processing, the resist film can be patterned with high accuracy, and it is possible to manufacture the substrate for making the microarray, where the monomolecular film has been formed in position-selectively with high accuracy in a target position.

The microarray can be used for the analyses of biomolecules.

This way, the microarray can be used for the analyses involved in gene sequences in analyses of biologically functional molecules, particularly such as DNA sequences and in genetic diagnosis.

As described above, by the use of the method for manufacturing the substrate for making the microarray of the present invention, when the monomolecular film having the silicon oxide chain is formed in position-selectively, it is possible by simpler treatment to obtain the substrate for making the microarray, where monomolecular film having the silicon oxide chain has been formed.

DESCRIPTION OF THE INVENTION AND A PREFERRED EMBODIMENT

Embodiments of the present invention is described below, but the present invention is not limited thereto.

In order to form a monomolecular film having a silicon oxide chain, a trivalent hydrolyzable silane compound substituted with an alkyl chain having a functional group for immobilization, which become a spacer for immobilizing a target molecule for recognition, is used. This compound becomes the monomolecular film having the silicon oxide chain by reacting OH group on a metal oxide surface or OH group generated by oxidizing the metal film surface with silicon atoms to be bound to a substrate surface, and further forming a bond of silicon-oxide-silicon by bound silane molecules one another.

The present inventors have found that when the monomolecular film having the silicon oxide chain having the functional group for immobilizing the target molecule is formed in position-selectively, if a chemically amplified positive resist film which has a very low content of hydroxyl group in a resin is used even if the resin is the resin for a positive type resist developed for ArF excimer laser exposure or resin of a type containing a hydroxystyrene based monomer as a composition used for KrF, adhering of the monomolecular film to the resist surface is prevented as well as a resist pattern which becomes unnecessary after forming the film can be removed by simple treatment with a solvent, and led to make the present invention.

That is, the present invention provides a method for manufacturing the substrate for making the microarray, comprising; at least, a step of forming a resist film on the substrate using a chemically amplified positive resist composition using a copolymer where a content of a monomer unit having a hydroxyl group is 5 mole % or less relative to total monomer units as a binder; a step of patterning the resist film; a step of forming a monomolecular film having a silicon oxide chain on the substrate having the patterned resist film; and subsequently a step of removing the resist film.

The microarray produced by the substrate for making the microarray of the present invention is particularly preferably applied when manufacturing the substrate for making the microarray by applying the method of present invention which is not limited to a fluorescence method, an electric method and the like on a semiconductor apparatus as a principle for the method of acquiring data.

When the analysis is performed by the electric method using the semiconductor apparatus, as the semiconductor apparatus, the method of fixing on a capacitor as shown in Domestic Re-publication of WO2003/087798 and the method of fixing to a gate electrode or the surface of a floating electrode connected to the gate electrode as shown in Japanese Patent Laid-open (Kokai) No. 2005-77210-A are known.

When the method of the present invention is used, in the case where an outmost surface of the material for the immobilization is a metal oxidized film, the hydroxyl group on the surface is sufficient and the surface is directly treated with a silicon compound described later, thereby being possible to form the monomolecular film having the silicon oxide chain. When an outmost layer is a metal film, a spontaneously oxidized film on the outmost layer may be used, or only a proximity of a surface layer may be oxidized with such as ozone, hydrogen peroxide, water or oxygen plasma to apply. In the method for detection not dependent on the electric method, it is also conceivable to apply on a resin substrate. In such a case, it is disclosed in Japanese Patent Laid-open (Kokai) No. 4-221630-A that the monomolecular film having the silicon oxide chain can be formed by treating the surface with electron beams or ion beams in an oxygen atmosphere.

According to the method of the present invention, the monomolecular film is selectively formed at the position where the target molecule for the recognition is immobilized on the substrate for the microarray. The followings are used for the material for forming the resist film used at that time.

First, for the type of the resist, an oxidative treatment by dry or wet etching is possible in the semiconductor processing, but as the method for treating the substrate on which the monomolecular film having an organic functional group of the present invention has been formed, it is preferable to dissolve in and remove with an organic solvent or dissolve in and remove with an alkali solution after treating with the acid. Thus, as the resist type, it is appropriate to select not a negative type whose solubility is changed by crosslinking to be insolubilized but a positive type resist.

Meanwhile, as the chemically amplified resist used here, it is preferable that the monomolecular film is not formed on the resist film in the step of forming the monomolecular film. It is the most preferable that the monomer unit containing the hydroxyl group is not contained as a polymerization unit in the polymer used in the resist composition as the binder, but it is permitted that the monomer unit containing the hydroxyl group is contained at up to 5% relative to the total monomer units. Thus, also in this sense, as the type of the resist, not the novolak based resist in which the presence of the hydroxyl group is essential in its mechanism but the chemically amplified positive resist is selected.

As the resist composition for exposure light at a wavelength of 200 nm or more, a phenol skeleton is used as the unit for giving the solubility in the alkaline aqueous solution, and this acts simultaneously as the unit for giving the adhesiveness of the resin to the substrate. Thus, the hydroxyl group was surely contained in the resin for the binder of the positive type resist. On the contrary, in the resist composition for the ArF excimer laser light, the unit for giving the solubility in the alkaline aqueous solution and the unit for giving the adhesiveness to the substrate are separated. Thus, many positive type resist compositions in which the presence of the hydroxyl group is not essential in its principle as described above have been developed. Consequently, for the abovementioned purpose, the polymer containing the resin for the resist developed for the ArF excimer laser exposure light, using the publicly known resin containing 5% or less monomer unit containing hydroxyl group relative to the total monomer unites, or the polymer containing the unit developed for the exposure light at the wavelength of 200 nm or more and having the acidic functional group protected with an acid decomposable protecting group, and a so-called adhesive group developed for the ArF excimer laser, can be applied.

As the unit having the acidic functional group protected with the acid decomposable protecting group, it is possible to use the unit having a phenolic hydroxyl group protected with such as a tertiary alkyl group, a tertiary alkoxycarbonyl group or an acetal group, more specifically, the unit having protected vinylphenol as well as protected carboxyl group, and more specifically such as protected vinyl benzoate and (meth) acrylic acid. Many of these have been already known publicly (e.g., Japanese Patent Laid-open (Kokai) No. 2006-225476-A, Japanese Patent Laid-open (Kokai) No. 2006-124314-A).

The acid decomposable protecting group protects the unit having the phenolic hydroxyl group and the unit having (meth) acrylic acid, and an example thereof may includes the following.

(1)

In the formula, R1 is a methyl group, an ethyl group, an isopropyl group, a cyclohexyl group, a cyclopentyl group, a vinyl group, an acetyl group, a phenyl group, a benzyl group or a cyano group, and a is an integer of 1 to 3.

As a cyclic alkyl group in the above formula (1), a five-membered ring (i.e., a=1) is preferable. Specific examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl and 1-cyanocyclohexyl.

The following is the group represented by the general formula (2).

(2)

In the formula, R2 is a methyl group, an ethyl group, an isopropyl group, a cyclohexyl group, a cyclopentyl group, a vinyl group, a phenyl group, a benzyl group or a cyano group.

Specific examples of the group represented by the above general formula (2) include t-butyl group, 1-methyl-1-vinyl-ethyl, 1-benzyl-1-methylethyl, 1-methyl-1-phenylethyl and 1-cyano-1-methylethyl.

The followings are the groups represented by the general formulae (3) and (4).

(3)

(4)

In the formulae, R3, R4, R5, R6 and R7 independently represent a hydrogen atom, a linear, branched or cyclic alkyl group having 1-8 carbon atoms; R3 and R4, R3 and R5, and R4 and R5 may form a ring, when the ring is formed, R3, R4 and R5 each represent a linear or branched alkylene group having 1-18 carbon atoms; R8 represents a linear, branched or cyclic alkyl group having 4-40 carbon atoms; b1 is a positive number and b2 is 0 or a positive number.

Here, as an acid labile group represented by the above general formula (3), specific examples include 1-methoxyethyl group, 1-ethoxyethyl group, 1-n-propoxyethyl group, 1-iso-propoxyethyl group, 1-n-butoxyethyl group, 1-iso-butoxyethyl group, 1-tert-butoxyethyl group, 1-cyclohexyloxyethyl group, 1-methoxypropyl group, 1-ethoxypropyl group, 1-methoxyisobutyl group, 1-isopropoxyisobutyl group, 1-methoxy-1-methyl-ethyl group and 1-ethoxy-1-methylethyl group.

Meanwhile, the acid labile group of the formula (4) includes, for example, tert-butoxycarbonyl group, tert-butoxycarbonylmethyl group, 1-ethylcyclopentyloxycarbonyl group, 1-ethylcyclohexyloxycarbonyl group and 1-methylcyclopentyloxycarbonyl group.

As the so-called adhesive group developed for the ArF excimer laser, the unit having a lactone structure exhibits a high adhesive effect to the substrate, and many of them have been already known publicly (e.g., Japanese Patent Laid-open (Kokai) No. 2006-124314-A).

Specifically, the followings are exemplified, but they are not limited thereto.

For a polymerization ratio of the above two units, if the unit having the acidic functional group protected with the acid decomposable protecting group is contained at 20 mole % or more, there is little possibility to reduce a resolution, and if the unit having the adhesive group is contained at 20 mole % or more, there is little possibility to cause a detachment problem.

In the present invention, particularly it is preferable in terms of assuring the good adhesiveness to the substrate of the resist film to use the copolymer containing the styrene derivative unit having the acidic functional group protected with the protecting group capable of being deprotected with the acid and the (meth) acrylic acid derivative unit having the lactone structure as the adhesive functional group, as the copolymer of the above binder.

An acid generator, and if necessary a basic substance and surfactants are further added to the composition for forming the resist film, and many of them have been already known publicly (e.g., Japanese Patent Laid-open (Kokai) No. 2006-225476-A, Japanese Patent Laid-open (Kokai) No. 2006-124314-A). Any of them can be used basically.

The above resist composition is dissolved in the solvent for application.

The solvent is not particularly limited as long as the resist composition is dissolved therein, and includes, but is not limited to, for example, butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butylolactone, propylene glycol methyl ether acetate, propylene glycol ethyl ether acetate, propylene glycol propyl ether acetate, methyl lactate, ethyl lactate, propyl lactate and tetramethylenesulfone. The particularly preferable organic solvents are propylene glycol alkyl ether acetate and alkyl lactate ester.

These organic solvents, which may be used alone or in admixture. The example of the preferable mixed solvent is the mixed solvent of propylene glycol alkyl ether acetate and alkyl lactate ether acetate. The alkyl group at that time includes those having 1-4 carbon atoms, e.g., a methyl group, an ethyl group and a propyl group, and among them, a methyl group and an ethyl group are suitable. This propylene glycol alkyl ether acetate has 1,2-substituted isomer and 1,3-substituted isomer, and three isomers by combination of substituted positions. They may be used alone or in admixture. The alkyl group in the above alkyl lactate ester includes those having 1-4 carbon atoms, e.g., a methyl group, an ethyl group and a propyl group, and among them, a methyl group and an ethyl group are suitable.

As the method for forming the resist film on the substrate using the resist composition obtained above, many methods such as a rotation application and a scan application have been known publicly. When the rotation application is used, a stable film thickness can be easily obtained. Furthermore, in order to remove the extra solvent from the applied film, typically a heating treatment referred to as pre-baking is performed to dry the resist film.

Subsequently, the step of patterning the resist film is performed.

Many of exposure procedures are known publicly, a pattern exposure using a mask and a beam exposure are included, and any of the methods can be taken. Furthermore, as an exposure light source, depending on a size and required accuracy of the objective pattern, even when the resist composition for ArF exposure is used, it is not necessary to use the ArF excimer laser light, and for example if the pattern of about 1 μm is formed, g-ray may be used for the light source using the resist composition for ArF exposure.

It is in general that a portion to remove the resist is exposed by the above exposure manipulation and subsequently a heating step after the exposure referred to as post-baking is performed before development. This step is the step of diffusing the acid generated from the acid generator by degradation with exposure in a certain region by heating to catalytically degrade the protecting group protecting the acidic side chain. For this manipulation, many examples are known publicly.

The resist pattern is obtained by subsequently developing the substrate given the above post-baking treatment with an aqueous alkali developer. In the developer, the organic solvent such as alcohols can be added in a small amount and the concentration is not particularly limited. In general, an aqueous solution of 2.38 N tetramethylammonium sodium is used.

In particular, when the commercially available ArF resist is used, the resist is adjusted to obtain the good pattern in this developer. Thus, it is preferable to use this solution as the developer.

After rinsing with purified water after treating with the developer, the substrate on which the resist pattern has been formed is once dried followed by being given the subsequent treatment. In this drying, water on the surface could be removed approximately, the surface may be heated as long as the resist composition is not degenerated, and the method such as vacuum drying may be employed.

The step of forming the monomolecular film having the silicon oxide chain is described in detail in Japanese Patent Laid-open (Kokai) No. 62-50657-A and Japanese Patent Laid-open (Kokai) No. 4-221630-A. For example, the monomolecular film is formed by treating a non-coated substrate on which the resist pattern which protects a face other than places where the materials for recognition are immobilized has been formed with a treating solution containing a silicon compound represented by the following general formula (5):

$$Y_3Si-(CH_2)_m-X \quad (5)$$

wherein m represents an integer of 3 or more, X denotes a functional group for the immobilization or a functional group precursor, and Y independently denotes a halogen atom or an alkoxy group having 1-4 carbon atoms, by the above method.

In the above formula, if m is the integer of 3 or more, the monomolecular film can be formed.

Also the monomolecular film may be formed by mixing the silane compound represented by the following general formula (6):

$$Y'_3Si-(CH_2)_n-CH_3 \quad (6)$$

wherein n represents an integer of 0 or more (m−2; m is a value in the above general formula (5)); and Y' denotes a halogen atom or an alkoxy group having 1-4 carbon atoms, with the silane compound of the above general formula (5) and using the mixture.

As the functional group X for immobilizing the target material for the recognition, an amino group is often used, but if the functional group precursor is used, a hydroxyl group or a formyl group protected with the protecting group may be employed.

When the above functional group X is the hydroxyl group protected with the protecting group, the hydroxyl group may be derived from monovalent alcohol or vicinal diol. As the protecting group of alcohol, many groups are known publicly, and representatives thereof include an acyl group and an acetal group. An oxyranyl group is a precursor of vicinal diol. Many of protecting groups of a formyl group are known, and those easily obtained and capable of being deprotected can include the formyl group protected with ketal.

The monomolecular film having the silicon oxide chain derived from the silane compound can be formed by the method disclosed in Japanese Patent Laid-open (Kokai) No. 62-50657-A. That is, to form the monomolecular film, for example, the solvent having extremely low polarity is used to make a solution of the silane compound represented by the general formula (5) or the mixture thereof with the silane compound of the general formula (6) at $2.0\times10^{-2}$ to $5.0\times10^{-2}$ mole/L which is relatively dilute, and the coated substrate where the portion not to be coated may be protected with the resist is immersed therein for 2 to 3 minutes in the case of trichlorosilane or for 2 hours in the case of trimethoxysilane.

The step of deprotecting when the protecting group is used for the above functional group X may be performed before or after detaching the resist pattern. For example, when the protecting group can be deprotected under the acidic condition, by treating the substrate on which the monomolecular film has been formed with the acid, the protecting group of the functional group for immobilizing the target material for the recognition is deprotected, and simultaneously with it, the protecting group of in the resist film cam also be deprotected. Thus, the resist film can be removed with the alkali developer. Also, the functional group for the immobilization may be deprotected after detaching the resist film with the organic solvent such as resist solvent.

By a series of the above steps, it is possible to simply form the monomolecular film having silicon oxide in only the required portion. When the protection group is used for the functional group X, the functional group for immobilizing the target material for the recognition can be introduced into only the required portion.

EXAMPLES

The present invention will be specifically described with reference to the following Examples, but the present invention is not limited to the following Examples.

Production Example 1

Production of
10-(methoxymethoxy)decyltrimethoxysilane

Under a nitrogen atmosphere, 64 g of trimethoxysilane and 0.57 g of acetic acid were dropped in a mixture of 100 g of 10-(methoxymethoxy)-1-decene and a catalytic amount of a solution of platinate chloride in tetrahydrofuran at 80° C. The reaction mixture was stirred at 80° C. for 3 hours, and distilled under reduced pressure to yield 131 g of an target compound.

10-(methoxymethoxy)decyltrimethoxysilane
Boiling point: 142° C./66 Pa
1R (liquid film) vmax: 2927, 2854, 2840, 1465, 1191, 1143, 1089, 1049 $cm^{-1}$.
$^{13}$C-NMR (150 MHz, $CDCl_3$) δ: 9.10, 22.55, 26.18, 29.19, 29.39, 29.56, 29.71, 33.09, 50.44, 55.03, 67.84, 96.34 ppm.
$^1$H-NMR (600 MHz, $CDCl_3$) δ: 0.59-0.62 (2H, m), 1.21-1.39 (14H, m), 1.52-1.57 (2H, quintet-like), 3.32 (3H, s), 3.48 (2H, t, J=7 Hz), 3.53 (9H, s), 4.58 (2H, s) ppm.

Production Example 2

Production of 11,12-epoxydodecyltrimethoxysilane

This was produced according to the method in Japanese Patent Laid-open (Kokai) No. 4-182491-A.
11,12-epoxydodecyltrimethoxysilane
1R (liquid film) vmax: 3041, 2925, 2854, 2840, 1727, 1465, 1911, 1089, 916 $cm^{-1}$.
$^{13}$C-NMR (150 MHz, $CDCl_3$) δ: 9.10, 22.54, 25.92, 29.18, 29.39, 29.40, 29.42, 29.48, 32.45, 33.08, 47.07, 50.42, 52.35 ppm. $^1$H-NMR (600 MHz, $CDCl_3$) δ: 0.59-0.62 (2H, m), 1.20-1.51 (20H, m), 2.421 (1H, dd, J=3.5 Hz), 2.70 (1H, t-like, J=5 Hz), 2.85-2.88 (1H, m) ppm.

Production Example 3

Production of Polymer for Resist t-Butoxystyrene:1-ethylcyclopentyl methacrylate:β-methacryloyloxy-γ-butylolactone=30:10:60
t-Butoxystyrene (17.6 g), 18.2 g of 1-ethylcyclopentyl methacrylate and 17.0 g of β-methacryloyloxy-γ-butylolactone were dissolved in 1100 g of methyl isobutyl ketone, and 1.3 g of AIBN was added, and then the mixture was heated at 80° C. for 8 hours. This was poured in hexane in a large amount to precipitate, further the precipitate was dissolved in methyl isobutyl ketone in a small amount, and reprecipitation was performed in hexane in the large amount. This manipulation yielded a copolymer having a molecular weight of about 8,000 and a dispersion degree of 2.0 and the above-mentioned constitution.

Production Example 4

Preparation of Resist Composition

[t-Butoxystyrene:1-ethylcyclopentyl methacrylate:β-methacryloyloxy-γ-butylolactone=30:10:60] (80 parts by mass), 6 parts by mass of triphenylsulfonium p-toluenesulfonate and 0.5 parts by mass of tributylamine were dissolved in 720 parts by mass of PGMEA, which was then filtrated through a filter to make a resist composition.

Example 1

Figure 1:
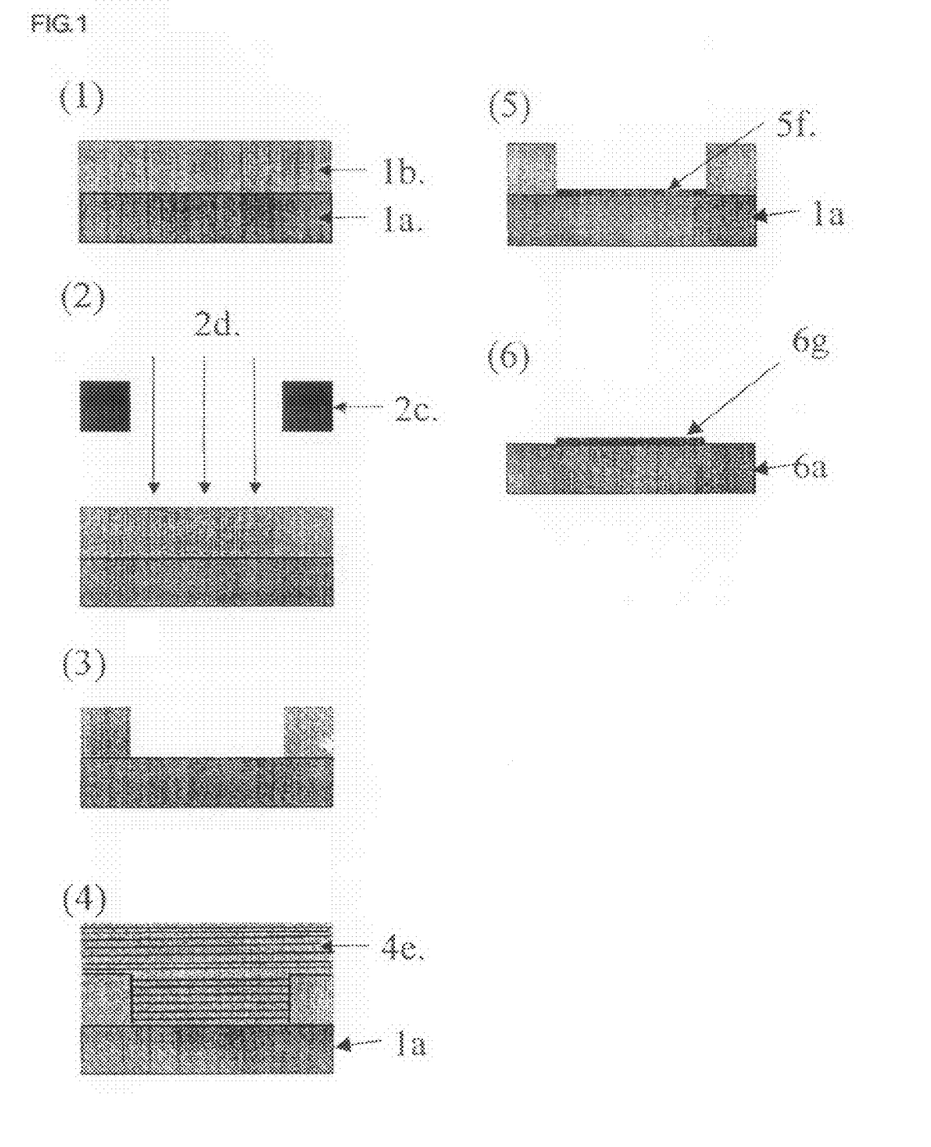
FIG. 1 is a schematic view showing one example of a method for manufacturing a substrate for making a microarray according to the present invention.

The resist composition prepared in the above Production Example 4 was spin-coated on a substrate 1a to be processed, to which pre-baking at 100° C. for 90 seconds was then given to yield a resist film 1b having a film thickness of 0.3 μm (FIG. 1 (1)).

Subsequently, KrF excimer laser light 2d was irradiated onto an area where a monomolecular film would be formed using a mask pattern 2c on this resist film 1b (FIG. 1 (2)). After the exposure, a resist pattern having an opening at the area where the monomolecular film would be formed was obtained by performing post-baking at 110° C. for 90 seconds and developing in an aqueous solution of 2.38% TMAH (FIG. 1 (3)).

Subsequently, one liter of a solution of 2.1 g 10-(methoxymethoxy)decyltrimethoxysilane obtained in Production Example 1 and 5.9 g of hexyltrimethoxysilane in 4% dichloromethane/hexane was prepared to make a monomolecular film forming material solution 4e. The substrate 1a was immersed in this monomolecular film forming material solution 4e for 3 minutes to form a monomolecular film 5f on the substrate 1a (FIG. 1 (5)). At that time, no monomolecular film was formed on the resist film.

Subsequently, the substrate 1a given the above immersion treatment was treated with a methanol solution prepared so that concentrated hydrochloric acid was at a concentration of 0.8% by mass at 60° C. for 30 minutes to deprotect methoxymethoxy group in the monomolecular film 5f to make hydroxyl group.

By further immersing the substrate 1a treated above in propylene glycol monomethyl ether to remove the resist film, the substrate 6a for making a microarray on which the monomolecular film 6g having the silicon oxide chain having the hydroxyl group as the functional group for the immobilization at the position for immobilizing the recognition material had been formed was obtained (FIG. 1 (6)).

Example 2

The resist pattern having the opening at the area where the monomolecular film would be formed was obtained in the same way as in Example 1. Subsequently, one liter of a solution of 2.0 g 11,12-epoxydodecyltrimethoxysilane obtained in Production Example 2 and 5.9 g of hexyltrimethoxysilane in 4% dichloromethane/hexane was prepared to make a monomolecular film forming material solution. The substrate was immersed in this monomolecular film forming material solution for 2 hours to form a monomolecular film on the substrate. At that time, no monomolecular film was formed on the resist film.

Subsequently, the substrate given the above immersion treatment was treated with a methanol solution prepared so that concentrated hydrochloric acid was at a concentration of 0.8% by mass at 60° C. for 30 minutes to deprotect an oxyranyl group in the monomolecular film to make a hydroxyl group.

By further immersing the substrate treated above in propylene glycol monomethyl ether to remove the resist film, the substrate for making the microarray on which the monomolecular film having the silicon oxide chain having the hydroxyl group as the functional group for the immobilization at the position for immobilizing the recognition material had been formed was obtained The present invention is not limited to the above embodiments. The above embodiments are exemplifications. Any of those which have substantially the same constitution and have the same effects as technical ideas described in claims of the present invention are included in the technical scope of the present invention.

The invention claimed is:

1. A method for manufacturing a substrate for making a microarray, comprising at least
    a step of forming a resist film on the substrate using a chemically amplified positive resist composition using a copolymer where a content of a monomer unit having a hydroxyl group is 5 mole % or less relative to total monomer units as a binder;
    a step of patterning the resist film;
    a step of forming a monomolecular film having a silicon oxide chain on the substrate having the patterned resist film at positions other than on the patterned resist film, the monomolecular film for immobilizing a target molecule; and
    subsequently a step of removing the patterned resist film to obtain a substrate for making a microarray,
    wherein the monomolecular film is formed by treating the substrate having the patterned resist film with a treating solution containing a silicon compound represented by the following general formula (5):

$Y_3Si$—$(CH_2)_m$—X (5)

wherein m represents an integer of 3 or more, X denotes any one of an amino group, a hydroxyl group protected with a protecting group, and a formyl group protected with a protecting group, and Y independently denotes a halogen atom or an alkoxy group having 1-4 carbon atoms.

2. The method for manufacturing the substrate for making the microarray according to claim 1, wherein a copolymer not containing the monomer unit having the hydroxyl group is used as the copolymer of the binder.

3. The method for manufacturing the substrate for making the microarray according to claim 2, wherein a copolymer containing a styrene derivative unit having an acidic functional group protected with a protecting group capable of being deprotected with an acid and a (meth)acrylate derivative unit having a lactone structure as an adhesive group is used as the copolymer of the binder.

4. The method for manufacturing the substrate for making the microarray according to claim 3, wherein the method further comprises a step of forming a microarray using the substrate and wherein the microarray is used for analyses of biomolecules.

5. The method for manufacturing the substrate for making the microarray according to claim 2, wherein the method further comprises a step of forming a microarray using the substrate and wherein the microarray is used for analyses of biomolecules.

6. The method for manufacturing the substrate for making the microarray according to claim 1, wherein a copolymer containing a styrene derivative unit having an acidic functional group protected with a protecting group capable of being deprotected with an acid and a (meth)acrylate derivative unit having a lactone structure as an adhesive group is used as the copolymer of the binder.

7. The method for manufacturing the substrate for making the microarray according to claim 6, wherein the method further comprises a step of forming a microarray using the substrate and wherein the microarray is used for analyses of biomolecules.

8. The method for manufacturing the substrate for making the microarray according to claim 1, wherein the method further comprises a step of forming a microarray using the substrate and wherein the microarray is used for analyses of biomolecules.

9. The method for manufacturing the substrate for making the microarray according to claim 1, wherein a step of deprotecting the hydroxyl group protected with the protecting group or the formyl group protected with the protecting group is performed before or after removing the patterned resist film.

* * * * *